United States Patent [19]

Erdel

[11] Patent Number: 4,698,813
[45] Date of Patent: Oct. 6, 1987

[54] ARRANGEMENT FOR CORRECTING BURST ERRORS IN SHORTENED CYCLICAL BLOCK CODES

[75] Inventor: Karlheinz Erdel, Munich, Fed. Rep. of Germany

[73] Assignee: Siemens Aktiengesellschaft, Berlin and Munich, Fed. Rep. of Germany

[21] Appl. No.: 728,048

[22] Filed: Apr. 29, 1985

[30] Foreign Application Priority Data

Apr. 27, 1984 [DE] Fed. Rep. of Germany ....... 3415765

[51] Int. Cl.⁴ ............................................. G06F 11/10
[52] U.S. Cl. .......................................... 371/40; 371/45
[58] Field of Search ......................... 371/2, 39, 40, 45

[56] References Cited

U.S. PATENT DOCUMENTS

| | | | |
|---|---|---|---|
| 3,542,756 | 11/1970 | Gallager | 371/40 |
| 3,801,955 | 4/1974 | Howell | 371/40 |
| 4,059,825 | 11/1977 | Greene | 371/40 |
| 4,488,302 | 12/1984 | Ahamed | 371/40 |

FOREIGN PATENT DOCUMENTS 2018095  10/1979  United Kingdom .................. 371/40

OTHER PUBLICATIONS

L. R. Bahl, "Shortened Cyclic Cod with Burst Error Detection and Sync. Recovery Capability", IBM Tech., vol. 16, No. 6, 11/1973, pp. 2026-2027.
Lin, An Introduction to Error–Correcting Codes, 1970, pp. 87-91.
Error–Correcting Codes, Second Edition, W. Wesley Peterson and E. J. Weldon, Jr., The MIT Press, Cambridge, Mass. 1972, pp. 364 through 370.

Primary Examiner—Jerry Smith
Assistant Examiner—Robert W. Beausoliel, Jr.
Attorney, Agent, or Firm—Hill, Van Santen, Steadman & Simpson

[57] ABSTRACT

A system for correcting burst errors with a maximum length of b bits in a reception signal, according to an error trapping method in cyclical block codes shortened by i bits, and wherein n bits are provided formed by r bits for a check part and k bits for the information. A syndrome register is provided having r stages. An overall input of the syndrome register is connected to a first exclusive-OR gate connected between two of the stages, a position of the first exclusive-OR gate being determined from coefficients of a pre-multiplication polynomial $p_2(x)$. An output of a last stage of the syndrome register is connected via a switch to a first stage of the register and also to at least one further exclusive-OR gate connected between two stages of the register whose position is derived from a generator polynomial $g(x)$ of the code. A zeros recognition unit is connected to each of the last r-b stages of the syndrome register. A buffer memory having n stages is provided which is connected to the overall input. A second exclusive-OR gate is connected to the output of the buffer memory, and is connected at a second input via a second switch to the output of the syndrome register. An output of the second exclusive OR gate forms an overall output of the system. An executive sequencer unit is provided for synchronizing the switches.

3 Claims, 3 Drawing Figures

ARRANGEMENT FOR CORRECTING BURST ERRORS IN SHORTENED CYCLICAL BLOCK CODES

BACKGROUND OF THE INVENTION

The invention relates to an arrangement for correcting burst errors with a maximum length of b bits according to the "Error Trapping" method in cyclical block codes shortened by i bits and having n bits composed of r bits for a check part and of k bits for an information part. A syndrome register having r stages is provided whereby an input is connected via at least one exclusive-OR gate connected between these stages. The position of the exclusive-OR gate is derived from the coefficients of a pre-multiplication polynomial. The output of the last stage is connected via a first switch to the input of the first stage and via at least one further exclusive-OR gate connected between the stages to further stages. The position thereof is derived from the generator polynomial of the code. A zero recognition means having r−b stages and connected to the stages of the syndrome register and a buffer memory having n stages and connected to the overall input is provided. A last exclusive-OR gate whose one input is connected to the output of the buffer memory, whose other input is connected via a second switch to the output of the syndrome register, and whose output is connected to the overall output is provided. An executive sequencer actuates all switches synchronously with a synchronization signal at the overall input. A clock supply is provided synchronized with the bit clock of the reception signal present at the overall input.

Such an arrangement is known from the book by W. Wesley Peterson, E. J. Weldon, Jr., *Error Correcting Codes*, The MIT Press, Cambridge, Mass., 1972, pages 364–370, especially FIG. 11.4, incorporated herein by reference.

In cyclical block codes, particularly for the correction of burst errors having the length b, the so-called "Error Trapping" method is a standard correction procedure. A cyclical block code is defined by its generator polynomial $g(x)$.

At the transmit side, a check part is connected to the information part by means of a syndrome register having r stages. A code word thus arises that can be mathematically represented as a polynomial with binary coefficients. This code word can be falsified in the transmission. It is referenced $v(x)$ at the receive side.

A receive-side decoding likewise occurs by means of a syndrome register having r stages. After input of the received code word, this contains nothing but zeros given freedom from error. When, by contrast, errors are present, ones also appear. The bit pattern in the syndrome register after input of the code word is referred to as syndrome.

In order to be able to begin immediately with the error correction after the decoding, an automatic pre-multiplication of the n-bit receive word $v(x)$ to be interpreted as polynomial is undertaken by the polynomial $x^r$. In terms of circuit technology, this means that the receive word after the last stage of the syndrome register is input via an exclusive-OR gate. The error correction begins after the conclusion of the input. For this purpose, the content of the syndrome register is cyclically shifted given a closed feedback until the first r−b stages contain only zeros. The last b stages then contain the error pattern.

When the block code is to be shortend by i bits, then the first i bits of the information code of every code word are set to zero and omitted after the coding. In the decoding, the shortened code word must be filled with zeros again. The attachment of zeros can be avoided when an additional pre-multiplication of the received code word is undertaken with the polynomial $x^i$, i.e. given a shortened block code the syndrome of the polynomial of the received code word $v(x)$ multiplied by the polynomial $p_1(x)$ is calculated. For the realization of this pre-multiplication, the pre-multiplication polynomial $p_1(x)$ must first be calculated, this deriving as a division remainder in the division of the polynomial $x^{r+i}$ by the generator polynomial $g(x)$:

$$p_1(x) = \mathrm{rem}\{x^{r+i} : g(x)\}$$

The coefficients of $p_1(x)$ define the places at which the receive word must be input into the syndrome register via exclusive-OR gates.

In the known correction arrangement for the shortened block code, a plurality of additional exclusive-OR gates are generally required in comparison to the correction arrangement for the unshortened code, even given a shortening by only a few bits.

SUMMARY OF THE INVENTION

An object of the invention is to specify a correction arrangement for the shortened block code which requires fewer exclusive-OR gates.

This object is achieved according to the invention by providing that the overall input is connected to the syndrome register via at least one exclusive-OR gate connected between the stages of the syndrome register, the position thereof being derived from the coefficients of a pre-multiplication polynomial $p_2(x)$. Also, the pre-multiplication polynomial $p_2(x)$ derives as a division remainder in the division of the polynomial $x^{b+i}$ by the generator polynomial $g(x)$. The zeros recognition means is connected to the last (r−b) stages of the syndrome register. The output of the syndrome register is provided following its $b^{th}$ stage.

It is advantageous when a NOR gate having r−b inputs is provided as the zeros recognition means and when an AND gate is provided in the executive sequencer. The one input of this AND gate is connected to the output of the zeros recognition means and the other input thereof is connected to the output of a freely addressably read-only memory whose inputs are connected to the outputs of a binary counter. Furthermore, a (b-1)-stage shift register is provided in the executive sequencer, and the input and stage outputs of this (b-1)-stage shift register are connected to inputs of an OR gate via whose output the second switch is directly controllable and the first switch is controllable via an inverter.

The arrangement of the invention is also suitable for the correction of cyclical block codes correcting single errors when the burst error length is set to b=1.

DESCRIPTION OF THE PREFERRED EMBODIMENTS

Figure 1:
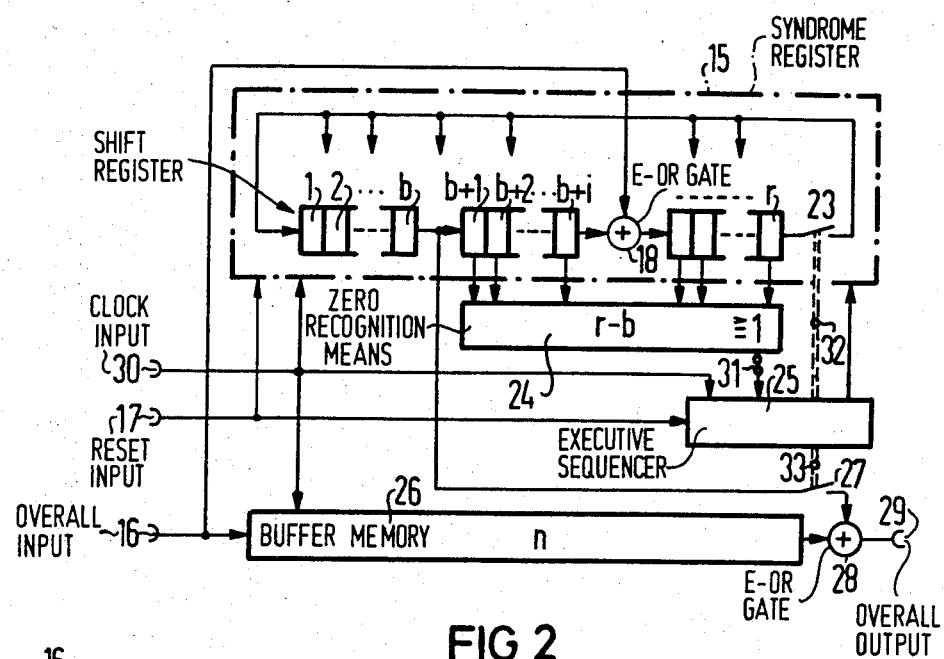
FIG. 1 shows a fundamental circuit diagram of the arrangement of the invention.

FIG. 1 shows the fundamental circuit diagram of the correction arrangement of the invention. This contains a syndrome register 15 having associated therewith a reset input 17, a zeros recognition means 24 having an output 31, an executive sequencer 25 having outputs 32 and 33, a buffer memory 26, a switch 27, an exclusive-OR gate 28, an overall input 16, an overall output 29, and a clock input 30.

The syndrome register 15 contains a shift register having r=n-k stages which is coupled via a switch 23 to various stage inputs. The input 16 is connected via the exclusive-OR gate 18 to the syndrome register 15. The output of this syndrome register 15 leads to the switch 27.

The switches 23 and 27 can be designed as gates.

Figure 2:
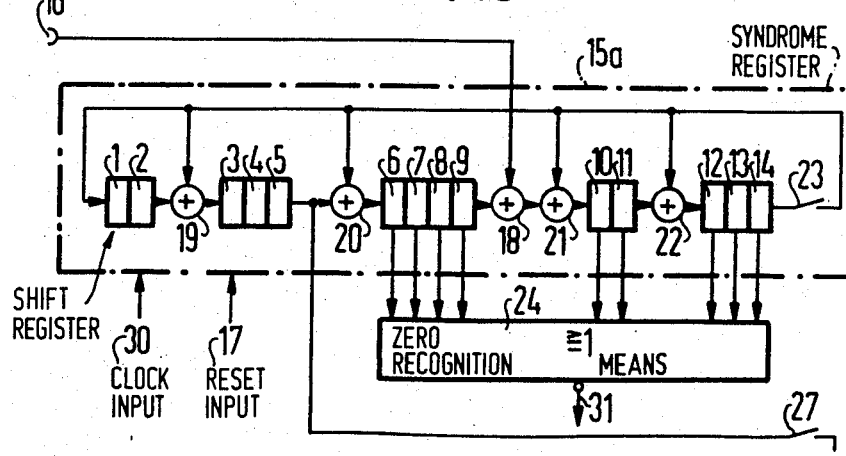
FIG. 2 shows a syndrome register for a (275,261) Fire code shortened by four bits (n=275, k=261)
Figure 3:
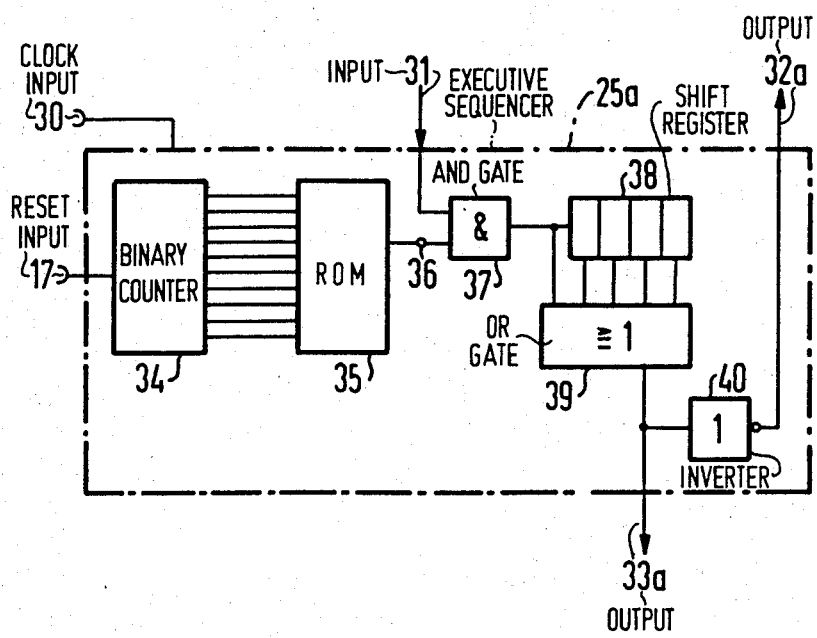
FIG. 3 shows an executive sequencer for this code.

The same reference characters have been selected for FIGS. 1-3. Reference characters not appearing in FIG. 1 may be found in FIG. 2 or 3. Let us now assume a faulty input signal.

The correction circuit of FIG. 1 functions as follow. An n-bit code word is input into the overall input 16, namely both into the syndrome register 15 which was set to zero before the input of the code word as well as into the buffer memory 26. The content of the syndrome register 15 circulates via the feedback loop until the entire code word has been input. Following via the input 16 are n zeros. The content now circulates in the syndrome register until the zeros recognition means 24 has recognized nothing but zeros in the stsges (b+1) through r. The switch 23 is now opened via the executive sequencer 25 and the switch 27 is closed. From the output of the syndrome register 15 following the $b^{th}$ stage, the content of the b stages which contain the burst error now proceeds via the switch 27 to the exclusive-OR gate 28 where they correct the bits read out from the buffer memory 26 at the error location.

When the zeros recognition means 24 has not responded after k shifts during the correction phase, then an uncorrectible error existed or the check part has faulty. After the $n^{th}$ shift, the syndrome register 15 is set to zero and the next code word is input. Errors in the check part can also be corrected by lengthening the correction phase to n clock periods. When only the errors in the information part are to be corrected, then a buffer register having k stages suffices.

An uncorrectible error is present when the burst error is longer than b or when more than one burst error appears per code word.

When the code words are transmitted in immediate succession, then two syndrome registers that function in alternating fashion are required when the shift clock of the registers 15, 26 is identical to the bit clock of the received code words.

The reset signal at the input 17 can be derived from the code word at the overall input 16 in any form whatsoever.

FIG. 2 shows a syndrome register 15a for a (275,261) Fire code shortened by i=4 bits and having the generator polynomial $g(x)=x^{14}+x^{11}+x^9+x^5+x^2+x^0$ which has a burst error correcting capacity of b=5. Since n=275 and k=261, r=14 applies. The syndrome register thus contains stages 1 through 14.

Valid for the unshortened code are n=279 and k=265. In accordance with the exponents of the generator polynomial g(x), the feedbacks lie from the output of stage 14, at the input of stage 1 and following the stages 2, 5, 9, and 11. Exclusive-OR gates 19-22 effect the in-couplings.

Valid for the pre-multiplication polynomial for code shortening is $$P_2(x)=\text{Rem}\{x^{b+i}\cdot g(x)\}=x^9$$

The input 16 of the syndrome register 15a thus lies following the stage 9. The in-coupling occurs via the exclusive-OR gate 18. The output of the syndrome registers lies following the stage 5 because of b=5.

FIG. 3 shows an executive sequencer 25a for the (275,261) Fire code syndrome register shown in FIG. 2. This contains a binary counter 34 having ten stages; a reset input 17; a freely addressable read-only memory (ROM) 35 having 1024 addressable memory cells, 10 address inputs, and an output 36; an AND gate 37; a shift register 38 having four stages, and four parallel outputs; an OR gate 39 having five inputs; an inverter 40; a clock input 30; an input 31; and two outputs 32a and 33a. Electromechanical converters (not shown) such as relays must lie between the terminals 32 and 33 on the one hand and the outputs 32a and 33a on the other hand. The switches 23 and 27 can also be replaced by gates.

Instead of the freely addressable read-only memory ROM 35, a corresponding circuit formed of gates and flipflops can also be employed.

The executive sequencer 25a of FIG. 3 functions as follows. The binary counter 34 is reset before the input of a code word into the input 16. During the input of the code word, the ROM 35 driven by the binary counter 34 outputs only zeros and thus inhibits the AND gate 37 during the decoding procedure. During the following correction phase lasting 261 clock periods, the ROM 35 outputs only ones and thus opens the AND gate 37. When the zeros recognition means 24 has recognized nothing but zeros during the correction phase, then it emits a pulse for one clock period at its output 31. This pulse proceeds through the AND gate 37 into the shift register 38. The pulse extended to five clock periods then appears at the output 33a of the OR gate 39. This then closes the switch 27 for five clock periods so that the correction signal can proceed into the exclusive-OR gate 28. At the same time, the extended pulse is inverted by the inverter 40 and the switch 23 is opened by the inverted pulse at the output 32a.

Although various minor changes and modifications might be proposed by those skilled in the art, it will be understood that I wish to include within the claims of the patent warranted hereon all such changes and modifications as reasonably come within my contribution to the art.

I claim as my invention:

1. An arrangement for correcting burst errors with a maximum length of b bits in a reception signal according to an error trapping method in cyclical block codes shortened by i bits, and wherein n bits are provided formed by r bits for a check part and k bits for an information part, comprising:

a syndrome register having r stages;
   an overall input of the arrangement being connected to at least a first exclusive-OR gate connected between two of the syndrome register stages, a position of the first exclusive-OR gate being determined from coefficients of a pre-multiplication polynomial $p_2(x)$;

an output of a last stage of the syndrome register being connected via a first switch to an input of a first stage of the register and also to at least one further exclusive-OR gate connected between two stages of the register, a position of the further exclusive-OR gate being derived from a generator polynomial g(x) of the code;

a zeroes recognition means having r–b stages and connected to each of the last r–b stages of the syndrome register;

a buffer memory having n stages and which is connected to said overall input;

another exclusive-OR gate having a first input connected to an output of the buffer memory, a second input connected via a second switch to an output of the syndrome register, and an output connected to an overall output of the arrangement;

an executive sequencer means for synchronizing the first and second switches with a synchronization signal;

a clock supply means for the arrangement synchronized with a bit clock of the reception signal;

said pre-multiplication polynomial $p_2(x)$ being derived as a division remainder in a division of a polynomial $x^{b+i}$ by the generator polynomial $g(x)$; and the output of the syndrome register being provided following the $b^{th}$ stage.

2. An arrangement for correcting burst errors with a maximum length of b bits in a reception signal according to an error trapping method in cyclical block codes shortened by i bits, and wherein n bits are provided formed by r bits for a check part and k bits for an information part, comprising:

a syndrome register having r stages;

an overall input of the arrangement being connected to at least a first exclusive-OR gate connected between two of the syndrome register stages, a position of the first exclusive-OR gate being determined from coefficients of a pre-multiplication polynomial $p_2(x)$;

an output of a last stage of the syndrome register being connected via a first switch to an input of a first stage of the register and also to at least one further exclusive-OR gate connected between two stages of the register, a position of the further exclusive-OR gate being derived from a generator polynomial g(x) of the code;

a zeros recognition means having r–b stages and connected to each of the last r–b stages of the syndrome register;

a buffer memory having n stages and which is connected to said overall input;

another exclusive-OR gate having a first input connected to an output of the buffer memory, a second input connected via a second switch to an output of the syndrome register, and an output connected to an overall output of the arrangement;

an executive sequencers means for synchronizing the first and second switches with a synchronization signal;

a clock supply means for the arrangement synchronized with a bit clock of the reception signal;

said pre-multiplication polynomial $p_2(x)$ being derived as a division remainder in a division of a polynomial $x^{b+i}$ by the generator polynomial $g(x)$; the output of the syndrome register being provided following the $b^{th}$ stage; and said executive sequencer means including an AND gate, a first input of the AND gate being connected to the output of said zeros recognition means and a second input thereof being connected to an output of a freely addressable read-only memory whose inputs are connected to outputs of a binary counter, and a (b−1) stage shift register, an input of said shift register being connected to an output of said AND gate, and its stage outputs being connected to inputs of an OR gate whose output is connected to directly control the second switch and also control the first switch via an inverter.

3. An arrangement for correcting burst errors with a maximum length of b bits in a reception signal according to an error trapping method in cyclical block codes shortened by i bits, and wherein n bits are proided formed by r bits for a check part and k bits for an information, comprising:

a syndrome register having r stages;

an overall input of the arrangement being connected to at least a first exclusive-OR gate connected between two of the syndrome register stages, a position of the first exclusive-OR gate being determined from coefficients of a pre-multiplication polynomial $p_2(x)$;

an output of a last stage of the syndrome register being connected via a first switch to an input of a first stage of the register and also to a plurality of further exclusive-OR gates with each gate being connected at different positions in the register between two adjacent stages of the register, positions of the further exclusive-OR gates being derived from a generator polynomial g(x) of the code;

a zeros recognition means having r–b stage and connected to each of the last r–b stages of the syndrome register;

a buffer memory having n stages and which is connected to said overall input;

another exclusive-OR gate having a first input connected to an output of the buffer memory, a second input connected via a second switch to an output of the syndrome register, and an output connected to an overall output of the arrangement;

an executive sequencer means connected to a clock supply for synchronizing the first and second switches with a synchronization signal;

said pre-multiplication polynomial $p_2(x)$ being derived as a division remainder in a division of a polynomial $x^{b+i}$ by the generator polynomial $g(x)$; and the output of the syndrome register being provided following the $b^{th}$ stage.

* * * * *